United States Patent
Chang et al.

(10) Patent No.: US 8,852,358 B2
(45) Date of Patent: Oct. 7, 2014

(54) PROCESS FOR SURFACE TREATING ALUMINUM OR ALUMINUM ALLOY AND ARTICLE MADE WITH SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Dun Mao, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 494 days.

(21) Appl. No.: 13/191,598

(22) Filed: Jul. 27, 2011

(65) Prior Publication Data
US 2012/0168034 A1 Jul. 5, 2012

(30) Foreign Application Priority Data

Dec. 30, 2010 (CN) .......................... 2010 1 0614785

(51) Int. Cl.
*C23C 22/40* (2006.01)
(52) U.S. Cl.
USPC ............................ 148/275; 148/240; 148/243
(58) Field of Classification Search
CPC ........ C23C 22/40; C23C 22/42; C23C 22/43; C23C 22/44; C23C 22/56
USPC .......................................... 148/240, 243, 275
See application file for complete search history.

*Primary Examiner* — Lois Zheng
(74) *Attorney, Agent, or Firm* — Novak Druce Connolly Bove + Quigg LLP

(57) ABSTRACT

A process for surface treating aluminum or aluminum alloy comprises the following steps. Providing a substrate made of aluminum or aluminum alloy. The substrate is treated with a chemical conversion treatment solution containing molybdate as the main film forming agent, to form a molybdate conversion film on the substrate. Then, a ceramic coating comprising refractory compound is formed on the molybdate conversion film by physical vapor deposition.

11 Claims, 4 Drawing Sheets

PROCESS FOR SURFACE TREATING ALUMINUM OR ALUMINUM ALLOY AND ARTICLE MADE WITH SAME

CROSS-REFERENCE TO RELATED APPLICATIONS

This application is related to co-pending U.S. patent application Ser. Nos. 13/191,592, and 13/191,586, each entitled "PROCESS FOR SURFACE TREATING ALUMINUM OR ALUMINUM ALLOY AND ARTICLE MADE WITH SAME", each invented by Chang et al. These applications have the same assignee as the present application. The above-identified applications are incorporated herein by reference.

BACKGROUND

1. Technical Field

The disclosure generally relates to a process for surface treating aluminum or aluminum alloy, and articles made of aluminum or aluminum alloy treated by the process.

2. Description of Related Art

Aluminum and aluminum alloy are becoming widely used in manufacturing components (such as housings) of electronic devices and cars because of their many desirable properties such as light weight and quick heat dissipation. However, aluminum or aluminum alloy have relatively low erosion resistance and abrasion resistance. One method for enhancing the erosion resistance of aluminum or aluminum alloy is to form ceramic coatings on its surface. However, magnesium alloy, typically casting magnesium alloy usually has recesses on its surface. Portions of the ceramic coatings corresponding to these recesses are usually thinner than other portions, causing these portions to be easily corroded (also known as pitting corrosion).

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary process for surface treating aluminum or aluminum alloy and articles made with same. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 3:
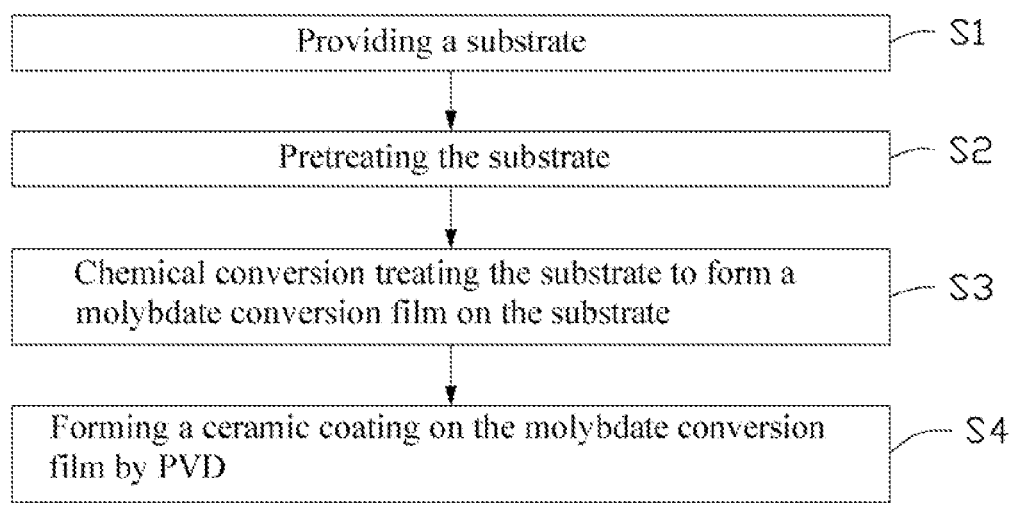
FIG. 3 is a block diagram of a process for the surface treatment of aluminum or aluminum alloy according to an exemplary embodiment.

Referring to FIG. 3, an exemplary process for the surface treatment of aluminum or aluminum alloy may include steps S1 to S4.

Figure 1:
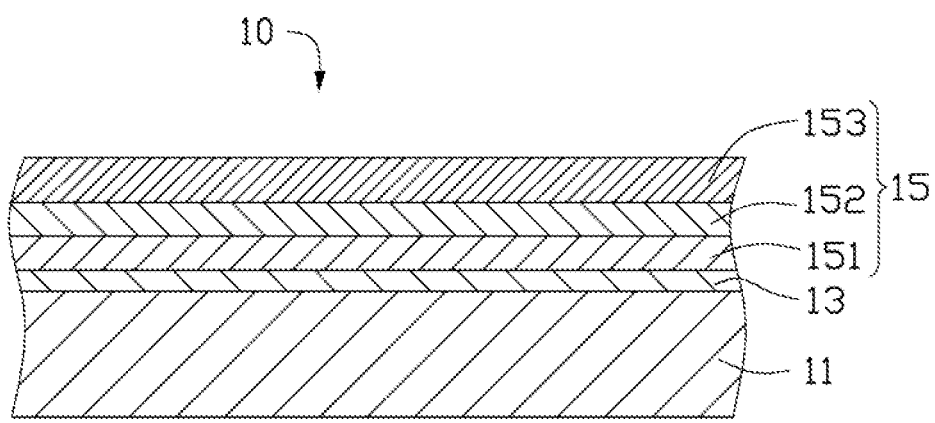
FIG. 1 is a cross-sectional view of an exemplary article treated by the present process.

In step S1, referring to FIG. 1, a substrate 11 is provided. The substrate 11 is made of aluminum or aluminum alloy.

In step S2, the substrate 11 is pretreated. The pretreatment may include the following steps.

The substrate 11 is chemically degreased with an aqueous solution, to remove impurities such as grease or dirt from the substrate 11. The aqueous solution contains about 25 g/L-30 g/L sodium carbonate ($Na_2CO_3$), about 20 g/L-25 g/L trisodium phosphate dodecahydrate ($Na_3PO_4.12H_2O$), and an emulsifier. The emulsifier may be a trade name emulsifier OP-10 (a condensation product of alkylphenol and ethylene oxide) at a concentration of about 1 g/L-3 g/L. The substrate 11 is immersed in the aqueous solution, which is maintained at a temperature of about 60° C.-80° C., for about 30 s-60 s. Then, the substrate 11 is rinsed.

Then, the degreased substrate 11 is etched in an alkaline etchant, to create a smooth surface and further remove any impurities. The alkaline etchant is an aqueous solution containing about 40 g/L-70 g/L sodium hydroxide (NaOH), about 10 g/L-20 g/L $Na_3PO_4.12H_2O$, about 25 g/L-30 g/L $Na_2CO_3$, and about 40 g/L-50 g/L sodium fluoride (NaF). The substrate 11 is immersed in the alkaline etchant, which is maintained at a temperature of about 40° C.-50° C., for about 3 s-5 s. During the etching, small sized protrusions on the substrate 11, such as burrs, are dissolved.

In step S3, when the pretreatment is finished, a molybdate conversion film 13 is formed on the substrate 11 by chemical conversion treatment using a chemical conversion treatment solution containing molybdate as the main film forming agent. The chemical conversion treatment solution is an aqueous solution containing about 8 g/L-15 g/L sodium molybdate ($Na_2MoO_4$), about 1 g/L-3 g/L sodium fluoride (NaF), and about 6 g/L-10 g/L potassium permanganate ($KMnO_4$). The pH value of the chemical conversion treatment solution may be in a range between about 2 and 4.

The method of chemical conversion treatment is not particularly limited, and can be performed under a common treatment condition by bringing the chemical conversion treatment solution into contact with the surface of the substrate 11. Examples of the method include an immersing method, a dipping method, or a spraying method. In this exemplary embodiment, the chemical conversion treatment is carried out by immersing the substrate 11 in the chemical conversion treatment solution maintained at a temperature of about 25° C.-40° C. for about 4 min-7 min. In an exemplary embodiment, the chemical conversion treatment solution is an aqueous solution containing about 10 g/L $Na_2MoO_4$, about 1 g/L NaF, and about 8 g/L $KMnO_4$. The pH value of the chemical conversion treatment solution is about 3. The substrate 11 is immersed in the chemical conversion treatment solution, which is maintained at a temperature of about 30° C., for about 5 min-6 min. During the chemical conversion treatment, the chemical conversion treatment solution may be stirred. Thereby, a molybdate conversion film 13 is formed on the substrate 11.

In step S4, a ceramic coating 15 is formed on the molybdate conversion film 13 by physical vapor deposition (PVD), such as vacuum sputtering or arc ion plating. The ceramic coating 15 may be a single layer or multilayer refractory compound. The refractory compound can be selected from one or more of the group consisting of nitride of titanium, aluminum, chromium, zirconium, or cobalt; carbonitride of titanium, aluminum, chromium, zirconium, or cobalt; and oxynitride of titanium, aluminum, chromium, zirconium, or cobalt.

In one exemplary embodiment, the ceramic coating 15 orderly includes a AlO layer 151 coated on the molybdate conversion film 13, a AlN layer 152, and a AlON layer 153. The AlO layer 151 is an aluminum-oxygen compound layer.

The AlN layer 152 is an aluminum-nitrogen compound layer. The AlON layer 153 is an aluminum-oxygen-nitrogen compound layer.

Figure 2:
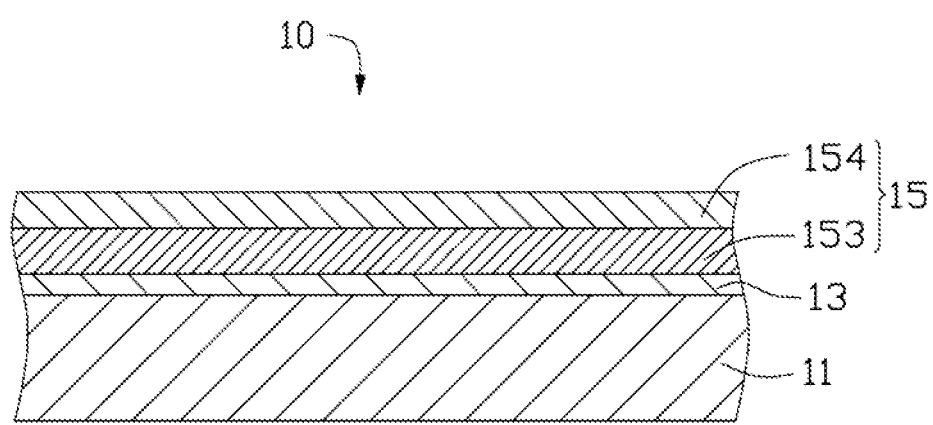
FIG. 2 is a cross-sectional view of another exemplary article treated by the present process.

Referring to FIG. 2, in another embodiment, the ceramic coating 15 includes an AlON layer 153 directly formed on the molybdate conversion film 13 and a CrON layer 154 formed on the AlON layer 153. The CrON layer 154 is a chromium-oxygen-nitrogen compound layer. An exemplary process for forming the AlON layer 153 and the CrON layer 154 may be performed by the following steps.

Figure 4:
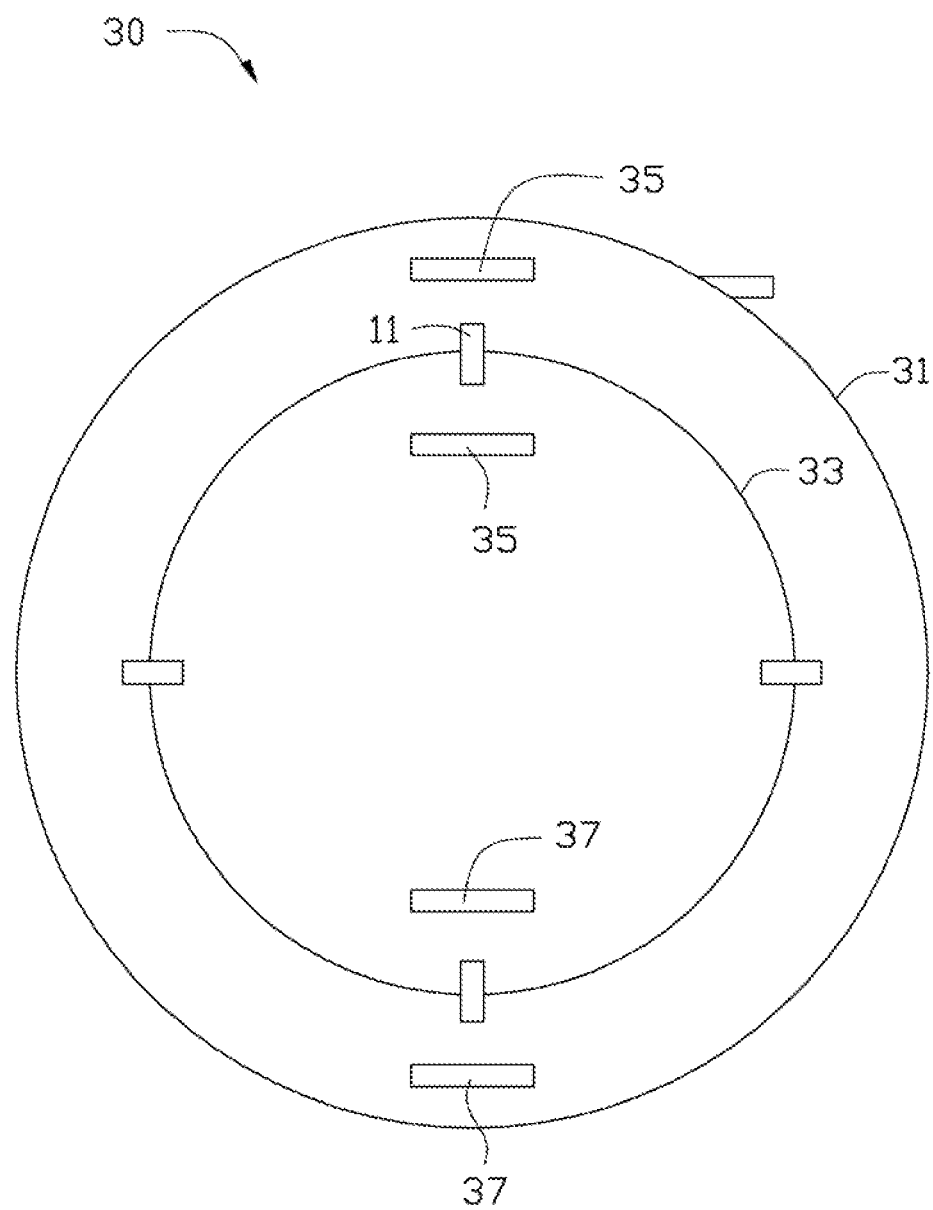
FIG. 4 is a schematic view of a vacuum sputtering machine for processing the exemplary article shown in FIG. 1.

The AlON layer 153 is directly formed on the molybdate conversion film 13 by vacuum sputtering. The substrate 11 is held on a rotating bracket 33 in a chamber 31 of a vacuum sputtering machine 30 as shown in FIG. 4. The chamber 31 is evacuated to maintain an internal pressure of about $6\times10^{-3}$ Pa to $8\times10^{-3}$ Pa and the inside of the chamber 31 is heated to a temperature of about 100° C. to about 150° C. The speed of the rotating bracket 33 is about 0.5 revolutions per minute (rpm) to about 1.0 rpm. Argon, oxygen, and nitrogen are simultaneously fed into the chamber 31, with the argon acting as a sputtering gas, and the oxygen and nitrogen acting as reaction gases. The flux of argon is about 150 standard-state cubic centimeters per minute (sccm) to about 300 sccm. The flux of oxygen is about 30 sccm to 60 sccm, and the flux of nitrogen is about 15 sccm to about 40 sccm. A bias voltage of about −100 volts (V) to about −300 V is applied to the substrate 11. Electric power of about 8 kW to about 10 kW is applied to aluminum targets 35 fixed in the chamber 31, depositing the AlON layer 153 on the molybdate conversion film 13. Depositing the AlON layer 153 may take for about 30 min-60 min. The power may be medium-frequency AC power.

Subsequently, the CrON layer 154 is directly formed on the AlON layer 153 also by vacuum sputtering. This step may be carried out in the same vacuum sputtering machine 30. The aluminum targets 35 are switched off. The flux of oxygen is adjusted to about 40 sccm to about 100 sccm, and the flux of nitrogen is adjusted to about 30 sccm to about 60 sccm. Electric power of about 8 kW to about 10 kW is applied to chromium targets 37, depositing the CrON layer 154 on the AlON layer 153. Depositing the CrON layer 154 may take for about 0.5 hour to about 2 hours. Other parameters are the same as during deposition of the AlON layer 153.

The molybdate conversion film 13 provides a smooth surface on the substrate 11, and by such means the ceramic coating 15 formed on molybdate conversion film 13 has a substantially even thickness, reducing the susceptibility to pit corrosion. In addition, the molybdate conversion film 13 firmly bonding with the substrate 11 has a good chemical stability and high density, having a good erosion resistance. Having a high resistance to abrasion, the ceramic coating 15 protects the molybdate conversion film 13 from mechanical abrasion.

FIG. 1 shows a cross-section of an exemplary article 10 made of aluminum or aluminum alloy and processed by the surface treatment process as described above. The article 10 may be a housing for an electronic device, such as a mobile phone. The article 10 includes the substrate 11 made of aluminum or aluminum alloy, the molybdate conversion film 13 formed on the substrate 11, and the ceramic coating 15 formed on the molybdate conversion film 13 by PVD. The molybdate conversion film 13 is formed by chemical conversion treatment using a chemical conversion treatment solution containing molybdate as the main film forming agent, as described above. The molybdate conversion film 13 results from chemical reaction of the chemical conversion treatment solution and the substrate 11. The ceramic coating 15 may be a single layer or multilayer refractory compound. The refractory compound can be selected from one or more of the group consisting of nitride of titanium, aluminum, chromium, zirconium, or cobalt; carbonitride of titanium, aluminum, chromium, zirconium, or cobalt; and oxynitride of titanium, aluminum, chromium, zirconium, or cobalt.

In one exemplary embodiment, the ceramic coating 15 orderly includes a AlO layer 151 adjacent to the molybdate conversion film 13, a AlN layer 152 on the AlO layer 151, and a AlON layer 153 on the AlN layer 152. The AlO layer 151 is an aluminum-oxygen compound layer. The AlN layer 152 is an aluminum-nitrogen compound layer. The AlON layer 153 is an aluminum-oxygen-nitrogen compound layer.

Referring to FIG. 2, in another embodiment, the ceramic coating 15 includes a AlON layer 153 directly formed on the molybdate conversion film 13 and a CrON layer 154 formed on the AlON layer 153. The CrON layer 154 is a chromium-oxygen-nitrogen compound layer.

A neutral salt spray test was applied to samples created by the present process. The test conditions included 5% NaCl (similar to salt-fog chloride levels), that was neutral at 35° C. to simulate condensing gases with moisture and salt. The test was an accelerated corrosion test for assessing coating performance. Erosion began to be observed after about 72 hours, indicating that the samples resulting from the present process have a good erosion resistance.

It is to be understood, however, that even through numerous characteristics and advantages of the exemplary disclosure have been set forth in the foregoing description, together with details of the system and functions of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A process for surface treating aluminum or aluminum alloy, the process comprising the following steps of:
   providing a substrate made of aluminum or aluminum alloy;
   forming a molybdate conversion film on the substrate by a chemical conversion treatment using a chemical conversion treatment solution containing molybdate as the main film forming agent; and
   forming a ceramic coating comprising a refractory compound on the molybdate conversion film by physical vapor deposition.

2. The process as claimed in claim 1, wherein the chemical conversion treatment solution is an aqueous solution containing about 8 g/L-15 g/L sodium molybdate $Na_2MoO_4$, about 1 g/L-3 g/L NaF, and about 6 g/L-10 g/L $KMnO_4$; the pH value of the chemical conversion treatment solution is in a range between about 2 and 4.

3. The process as claimed in claim 2, wherein the chemical conversion treatment is carried out by bringing the substrate in contact with the chemical conversion treatment solution maintained at a temperature of about 25° C.-40° C. for about 4 min-7 min.

4. The process as claimed in claim 2, wherein the chemical conversion treatment solution is an aqueous solution containing about 10 g/L $Na_2MoO_4$, about 1 g/L NaF, and about 8 g/L $KMnO_4$; the pH value of the chemical conversion treatment solution is about 3.

5. The process as claimed in claim 4, wherein the chemical conversion treatment is carried out by bringing the substrate in contact with the chemical conversion treatment solution maintained at a temperature of about 30° C. for about 5 min-6 min.

6. The process as claimed in claim 1, wherein the refractory compound is selected from one or more of the group consisting of nitride of titanium, aluminum, chromium, zirconium, or cobalt; carbonitride of titanium, aluminum, chromium, zirconium, or cobalt; and oxynitride of titanium, aluminum, chromium, zirconium, or cobalt.

7. The process as claimed in claim 6, wherein the ceramic coating orderly includes a AlO layer adjacent to the molybdate conversion film, a AlN layer on the AlO layer, and a AlON layer on the AlN layer; the AlO layer is an aluminum-oxygen compound layer; the AlN layer is an aluminum-nitrogen compound layer; the AlON layer is an aluminum-oxygen-nitrogen compound layer.

8. The process as claimed in claim 6, wherein the ceramic coating includes a AlON layer formed on the molybdate conversion film and a CrON layer formed on the AlON layer; the AlON layer is an aluminum-oxygen-nitrogen compound layer; the CrON layer is a chromium-oxygen-nitrogen compound layer.

9. The process as claimed in claim 1, wherein the physical vapor deposition uses a vacuum sputtering method or an arc ion plating method.

10. The process as claimed in claim 1, further comprising etching the substrate using an alkaline etchant containing about 40 g/L-70 g/L NaOH, about 10 g/L-20 g/L $Na_3PO_4 \cdot 12H_2O$, about 25 g/L-30 g/L $Na_2CO_3$, and about 40 g/L-50 g/L NaF, before treating the substrate with the chemical conversion treatment solution.

11. The process as claimed in claim 10, wherein the etching step is carried out by immersing the substrate in the alkaline etchant, which is maintained at a temperature of about 40° C.-50° C., for about 3 s-5 s.

* * * * *